(12) United States Patent
Chen et al.

(10) Patent No.: US 10,818,645 B1
(45) Date of Patent: Oct. 27, 2020

(54) BACKLIGHT MODULE AND DISPLAY DEVICE WITH BACKLIGHT MODULE

(71) Applicant: FOSHAN NATIONSTAR OPTOELECTRONICS CO., LTD, Foshan, Guangdong (CN)

(72) Inventors: Junhua Chen, Guangdong (CN); Fabo Liu, Guangdong (CN); Danlei Gong, Guangdong (CN); Zhonghai Yan, Guangdong (CN); Yihua Tan, Guangdong (CN)

(73) Assignee: FOSHAN NATIONSTAR OPTOELECTRONICS CO., LTD, Foshan, Guangdong (CN)

( * ) Notice: Subject to any disclaimer, the term of this patent is extended or adjusted under 35 U.S.C. 154(b) by 0 days.

(21) Appl. No.: 16/870,901

(22) Filed: May 9, 2020

(30) Foreign Application Priority Data

May 9, 2019 (CN) .......................... 2019 1 0385793

(51) Int. Cl.
| | |
|---|---|
| *F21V 23/00* | (2015.01) |
| *H01L 25/13* | (2006.01) |
| *F21V 3/04* | (2018.01) |
| *F21V 9/32* | (2018.01) |
| *F21V 5/02* | (2006.01) |
| *F21V 13/12* | (2006.01) |
| *F21Y 105/16* | (2016.01) |
| *F21Y 115/10* | (2016.01) |

(52) U.S. Cl.
CPC ................ *H01L 25/13* (2013.01); *F21V 3/04* (2013.01); *F21V 5/02* (2013.01); *F21V 9/32* (2018.02); *F21V 13/12* (2013.01); *F21Y 2105/16* (2016.08); *F21Y 2115/10* (2016.08)

(58) Field of Classification Search
None
See application file for complete search history.

(56) References Cited

U.S. PATENT DOCUMENTS

| | | | |
|---|---|---|---|
| 2007/0262732 A1* | 11/2007 | Shen ....................... | G09G 3/342 315/312 |
| 2008/0025019 A1* | 1/2008 | Kim ................... | G02F 1/133603 362/231 |
| 2012/0087122 A1* | 4/2012 | Takeuchi .......... | G02F 1/133605 362/235 |
| 2014/0232259 A1* | 8/2014 | Kawashima ........... | H05B 45/00 313/512 |
| 2018/0075625 A1* | 3/2018 | Li .......................... | H01L 33/34 |

\* cited by examiner

*Primary Examiner* — Elmito Breval
(74) *Attorney, Agent, or Firm* — Gang Yu

(57) ABSTRACT

Some embodiments of the present disclosure provide a backlight module and a display device with the backlight module. The backlight module includes a plurality of Light-Emitting Diode (LED) luminous units arranged at intervals. Part of the plurality of LED luminous units are a plurality of first luminous units A with a first luminous peak wavelength, and the other part of the plurality of LED luminous units are plurality of second luminous units C with a second luminous peak wavelength, wherein the first luminous peak wavelength being less than a preset wavelength and the second luminous peak wavelength being greater than the preset wavelength. The plurality of first luminous units A and the plurality of second luminous units C are alternately arranged in sequence on the substrate, and in any two adjacent LED luminous units, one is a first luminous unit A and the other is a second luminous unit C.

18 Claims, 2 Drawing Sheets

BACKLIGHT MODULE AND DISPLAY DEVICE WITH BACKLIGHT MODULE

CROSS-REFERENCE TO RELATED APPLICATION(S)

The present disclosure claims priority to Chinese Patent Application No. 201910385793.6, filed on May 9, 2019 and entitled "Backlight Module and Display Device with Backlight Module", the contents of which are hereby incorporated by reference in its entirety.

TECHNICAL FIELD

The present disclosure relates to a technical field of Light-Emitting Diode (LED) lighting technology, and particularly to a backlight module and a display device with the backlight module. A structure of the backlight module is mainly optimized and improved.

BACKGROUND

LED backlight module is an indispensable key assembly of a display device in a present mainstream display technology, and a basic principle for white light synthesis is that a blue LED luminous unit excites phosphor or another fluorescent material such as a quantum dot material to generate light of another band and the light is mixed with blue light to form white light.

An excitation wavelength of a fluorescent material and a Liquid Crystal Display (LCD) filter have a certain requirement on a wavelength range of blue light, so that, when an LED luminous unit is selected, a wavelength range of blue light emitted by the LED luminous unit is required to be accurately controlled. That is, in the art known to inventors, when an LED luminous unit for manufacturing an LED backlight module is selected, it is necessary to ensure that a wavelength range of blue light emitted by the LED luminous unit is in a preset wavelength range. A large number of LE'D luminous units are required by manufacturing of an LED backlight module, and if it is ensured that luminous peak wavelengths of all the LED luminous units are in the preset wavelength range, namely LED luminous units of a same wavelength specification are adopted to manufacture the LED backlight module, LED luminous units of which luminous peak wavelengths are outside the preset wavelength range are scrapped and are not normally used. Consequently, the effective utilization rate of the LED luminous units is greatly reduced, which greatly increases the manufacturing cost of the LED backlight module and disadvantage a display device in economy and market competitiveness.

SUMMARY

Some embodiments of the present disclosure provide a backlight module and a display device with the backlight module, to solve the problem in the art known to inventors that the manufacturing cost of an LED backlight module is greatly increased and a display device is disadvantaged in economy and market competitiveness because the effective utilization rate of LED luminous units is excessively low when the LED backlight module is manufactured.

Some embodiments of the disclosure are achieved by the following solution, some embodiments of the present disclosure provide a backlight module, which includes a substrate and a plurality of LED luminous units, wherein the plurality of LED luminous units are arranged at intervals on the substrate in a length direction and width direction of the substrate; wherein part of the plurality of LED luminous units are a plurality of first luminous units A with a first luminous peak wavelength, and the other part of the plurality of LED luminous units are a plurality of second luminous units C with a second luminous peak wavelength, wherein the first luminous peak wavelength is less than a preset wavelength, the preset wavelength is a peak wavelength after light mixing of the plurality of LED luminous units and the second luminous peak wavelength is greater than the preset wavelength; and the plurality of first luminous units A and the plurality of second luminous units C are alternately arranged in sequence in the length direction and width direction of the substrate such that one of any two adjacent LED luminous units of the plurality of light-emitting diode luminous units in the length direction or width direction of the substrate is a first luminous unit A and the other of the any two adjacent LED luminous units is a second luminous unit C.

In an exemplary embodiment, the LED luminous unit is an LED luminous device.

In an exemplary embodiment, the first luminous peak wavelength is in a first optional range value, and a difference value between a maximum value and minimum value in the first optional range value is greater than 0 nm and less than or equal to 3 nm; the second luminous peak wavelength is in a second optional range value, and a difference value between a maximum value and minimum value in the second optional range value is greater than 0 nm and less than or equal to 3 nm; and the preset wavelength is in a third optional range value, and a difference value between a maximum value and minimum value in the third optional range value is greater than 0 nm and less than or equal to 3 nm.

In an exemplary embodiment, the first optional range value is 441 nm to 443 nm, the second optional range value is 445 nm to 447 nm, and the third optional range value is 443 nm to 445 nm.

In an exemplary embodiment, the plurality of LED luminous units are distributed on the substrate in form of a matrix, and a center distance between two adjacent LED luminous units in the plurality of light-emitting diode luminous units is more than or equal to 3 mm and less than or equal to 15 mm.

In an exemplary embodiment, the substrate includes one of an FR-4 substrate, an aluminum substrate and a Bismaleimide Triazine (BT) substrate.

In an exemplary embodiment, the first luminous peak wavelength is in a first alternative range value, the second luminous peak wavelength is in a second alternative range value, the preset wavelength is in a third alternative range value, a maximum value in the third alternative range value is a half of a sum of a maximum value in the first alternative range value and a maximum value in the second alternative range value, and a minimum value in the third alternative range value is a half of a sum of a minimum value in the first alternative range value and a minimum value in the second alternative range value.

In an exemplary embodiment, a difference value between the maximum value and minimum value in the first alternative range value is greater than 0 nm and less than or equal to 3 nm, a difference value between the maximum value and minimum value in the second alternative range value is greater than 0 nm and less than or equal to 3 nm, and a difference value between the maximum value and minimum value in the third alternative range value is greater than 0 nm and less than or equal to 3 nm.

Some embodiments of the present disclosure provide a display device, which includes an optical module and the above mentioned backlight module, wherein the optical module and the backlight module are arranged at intervals, and the optical module include an optical component layer, a conversion film layer and a liquid crystal glass layer.

In an exemplary embodiment, a spacing distance between the backlight module and the optical module is more than or equal to 2 mm and less than or equal to 12 mm.

In an exemplary embodiment, the optical component layer includes a diffuser plate, a diffusion film and a prism film, and the conversion film layer includes a phosphor film layer including one or more of yellow phosphor, green phosphor and red phosphor or a quantum dot film layer.

With application of the technical solutions of some embodiments of the present disclosure, the LED luminous units of which peak wavelengths are outside a preset wavelength range required by manufacturing of the backlight module are classified, namely these LED luminous units are divided into the plurality of first luminous units A with the first luminous peak wavelength and the plurality of second luminous units C with the second luminous peak wavelength, and then the plurality of first luminous units A and the plurality of second luminous units C are reasonably arranged, namely the plurality of first luminous units A and the plurality of second luminous units C are alternately arranged in sequence in the length direction and width direction of the substrate and one of any two adjacent LED luminous units in the length direction or width direction of the substrate is a first luminous unit A and the other one of the any two adjacent LED luminous units is a second luminous unit C. In such case, the first luminous peak wavelength of the first luminous unit A is less than the preset wavelength, and the second luminous peak wavelength of the second luminous unit C is greater than the preset wavelength, so that a peak wavelength after light mixing of the adjacent first luminous unit A and second luminous unit C is in the preset wavelength range required by manufacturing of the backlight module, a design requirement of the backlight module is met, the utilization rate of the LED luminous units is effectively increased, the number of scrapped LED luminous units is reduced, the manufacturing cost of the backlight module is further reduced, and improvement of the economy and market competitiveness of the display device is facilitated.

BRIEF DESCRIPTION OF THE DRAWINGS

The drawings forming a part of some embodiments of the present application in the specification are adopted to provide a further understanding to the present disclosure. Schematic embodiments of the present disclosure and descriptions thereof are adopted to explain the present disclosure and not intended to form improper limits to the present disclosure. In the drawings.

Herein, the drawings include the following reference signs:

1, backlight module; 10, substrate; 20, LED luminous unit; 21, first luminous unit A; 22, second luminous unit C; 2, optical module; 201, optical component layer; 202, conversion film layer; and 203, liquid crystal glass layer.

DETAILED DESCRIPTION OF THE EMBODIMENTS

The technical solutions in embodiments of the present disclosure will be clearly and completely described below in combination with the drawings in the embodiments of the present disclosure. It is apparent that the described embodiments are only part of the embodiments of the present disclosure but not all of the embodiments. The following description of at least one exemplary embodiment is only illustrative actually, and is not used as any limitation for the present disclosure and the present application or use thereof. All other embodiments obtained by those of ordinary skill in the art based on the embodiments in the present disclosure without creative work shall fall within the scope of protection of the present disclosure.

Figure 3:
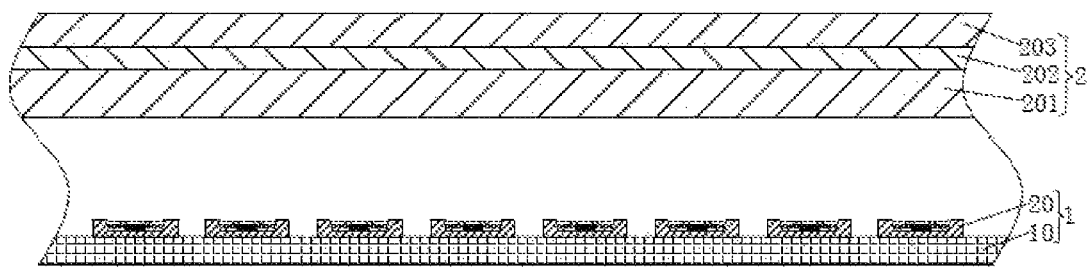
FIG. 3 illustrates a partial structure diagram of a display device with the backlight module in FIG. 1 according to an optional embodiment of the present disclosure.

For solving the problem in the art known to inventors that the manufacturing cost of an LED backlight module is greatly increased and a display device is disadvantaged in economy and market competitiveness because the effective utilization rate of LED luminous units is excessively low when the LED backlight module is manufactured, Some embodiments of the present disclosure provide a backlight module and a display device with the backlight module. As shown in FIG. 3, the display device includes a backlight module 1 and optical module 2 that are arranged at intervals. The backlight module 1 is the abovementioned and undermentioned backlight module, and the optical module 2 includes an optical component layer 201, a conversion film layer 202 and a liquid crystal glass layer 203.

Figure 1:
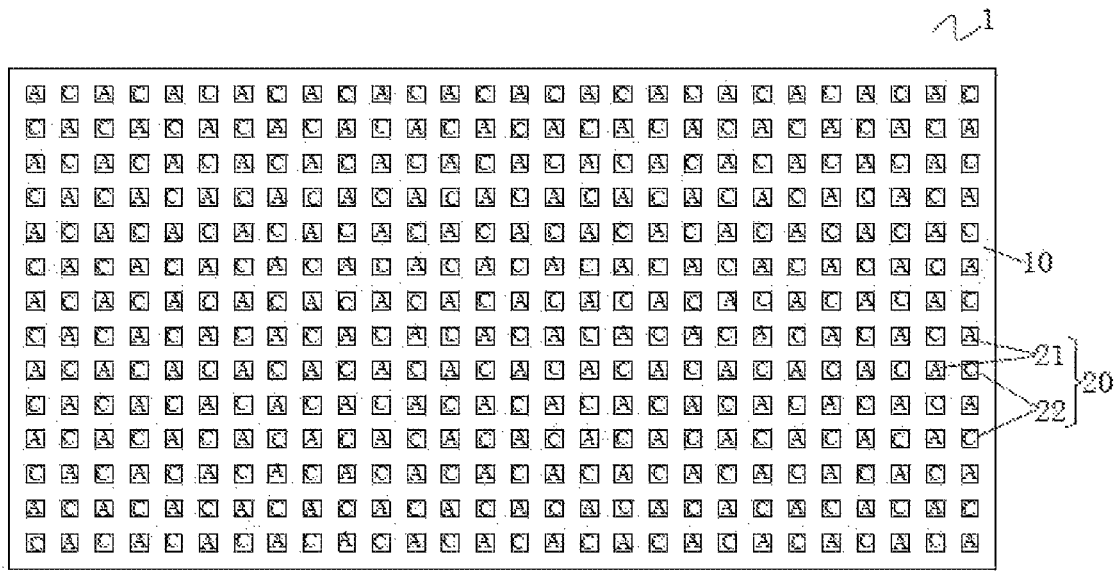
FIG. 1 illustrates a schematic distribution diagram of a plurality of first luminous units A and a plurality of second luminous units C of a backlight module according to an optional embodiment of the present disclosure.

As shown in FIG. 1, the backlight module 1 includes a substrate 10 and a plurality of LED luminous unit 20, wherein the plurality of LED luminous units 20 are arranged at intervals on the substrate 10 in a length direction and width direction of the substrate 10. Part of the plurality of LED luminous units 20 are a plurality of first luminous units A 21 with a first luminous peak wavelength, and the other part of the plurality of LED luminous units 20 are a plurality of second luminous units C 22 with a second luminous peak wavelength, the first luminous peak wavelength is less than a preset wavelength, the preset wavelength is a peak wavelength after light mixing of the plurality of LED luminous units 20 and the second luminous peak wavelength is greater than the preset wavelength. The plurality of first luminous units A 21 and the plurality of second luminous units C 22 are alternately arranged in sequence in the length direction and width direction of the substrate 10 such that one of any two adjacent LED luminous units 20 of the plurality of light-emitting diode luminous units in the length direction or width direction of the substrate 10 is a first luminous unit A 21 and the other of the any two adjacent LED luminous units 20 is a second luminous unit C 22.

The LED luminous units 20 of which peak wavelengths are outside a preset wavelength range required by manufacturing of the backlight module 1 are classified, namely these LED luminous units 20 are divided into the plurality of first luminous units A 21 with the first luminous peak wavelength and the plurality of second luminous units C 22 with the second luminous peak wavelength, and then the plurality of first luminous units A 21 and the plurality of second luminous units C 22 are reasonably arranged, namely the plurality of first luminous units A 21 and the plurality of second luminous units C 22 are alternately arranged in sequence in the length direction and width direction of the substrate 10 and one of any two adjacent LED luminous units 20 in the length direction or width direction of the substrate 10 is a first luminous unit A 21 and the other one of the any two adjacent LED luminous units 20 is a second luminous unit C 22. In such case, the first luminous peak wavelength of the first luminous unit A 21 is less than the preset wavelength, and the second luminous peak wavelength of the second luminous unit C 22 is greater than the preset wavelength, so that a peak wavelength after light mixing of the adjacent first luminous unit A 21 and second luminous unit C 22 is in the preset wavelength range required by manufacturing of the backlight module 1, a design requirement of the backlight module 1 is met, the utilization rate of the LED luminous units 20 is effectively increased, the number of scrapped LED luminous units 20 is reduced, the manufacturing cost of the backlight module 1 is further reduced, and improvement of the economy and market competitiveness of the display device is facilitated.

It is to be supplemented that, when the backlight module 1 is manufactured, the plurality of LED luminous units 20 are arranged on the substrate 10, the plurality of LED luminous units 20 include the plurality of first luminous units A 21 and the plurality of second luminous units C 22, but luminous units disposed on the substrate 10 are not limited to the two types, in some embodiments of the present disclosure, standard luminous units of which peak wavelengths are the preset wavelength are disposed. The backlight module 1 in this structural form also falls within the scope of protection of the present application.

Figure 2:
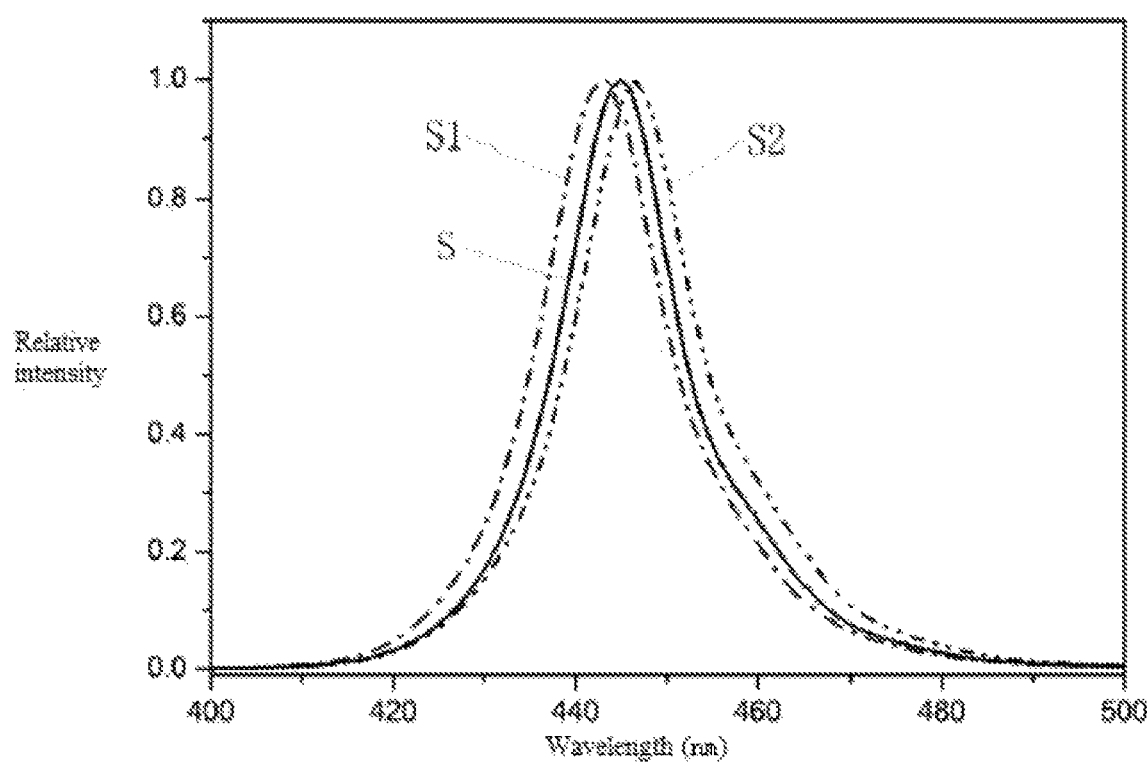
FIG. 2 illustrates a wavelength-intensity characteristic curve diagram including a wavelength-intensity characteristic curve S1 of the first luminous unit A in FIG. 1, a wavelength-intensity characteristic curve S2 of the second luminous unit C in FIG. 1 and a synthetic wavelength-intensity characteristic curve S of the first luminous unit A and the second luminous unit C.

As shown in FIG. 2, FIG. 2 illustrates a wavelength-intensity characteristic curve diagram including a wavelength-intensity characteristic curve S1 of the first luminous unit A in FIG. 1, a wavelength-intensity characteristic curve S2 of the second luminous unit C in FIG. 1 and a synthetic wavelength-intensity characteristic curve S compounded with the first luminous unit A and the second luminous unit C. It can be seen that the synthetic wavelength-intensity characteristic curve S compounded with the first luminous unit A and the second luminous unit C is obviously better than the wavelength-intensity characteristic curve S1 of the first luminous unit A and the wavelength-intensity characteristic curve S2 of the second luminous unit C, so that the wavelength-intensity characteristic curve S is more reasonable and meets a manufacturing requirement of the backlight module 1.

In some embodiments, the LED luminous unit 20 is an LED luminous device or an LED luminous chip. The LED luminous device includes a bracket, an LED chip in the bracket and an encapsulating colloid covering the LED chip. In an embodiment of the present application, the LED luminous device includes an LED chip and an encapsulating colloid covering the LED chip.

In some embodiments, the LED luminous unit 20 is a blue LED luminous device or a blue LED luminous chip. The LED luminous device has high luminous performance and is used more extensively. For a backlight module 1 manufactured by the blue LED luminous units, the product is protected more pertinently.

In an optional embodiment of the present disclosure, the first luminous peak wavelength is in a first optional range value, and a difference value between a maximum value and minimum value in the first optional range value is greater than 0 nm and less than or equal to 3 nm; the second luminous peak wavelength is in a second optional range value, and a difference value between a maximum value and minimum value in the second optional range value is greater than 0 nm and less than or equal to 3 nm; and the preset wavelength is in a third optional range value, and a difference value between a maximum value and minimum value in the third optional range value is greater than 0 nm and less than or equal to 3 nm. This is more favorable for reasonably utilizing the LED luminous units 20 of which the peak wavelengths are greatly deviates from the preset wavelength, reducing the manufacturing cost of the backlight module 1 and improving the economic performance of the display device.

In some embodiments, the first optional range value is 441 nm to 443 nm, the second optional range value is 445 nm to 447 nm, and the third optional range value is 443 nm to 445 nm.

As shown in FIG. 1, the plurality of LED luminous units 20 are distributed on the substrate 10 in form of a matrix, and a center distance between two adjacent LED luminous units 20 in the plurality of light-emitting diode luminous units is more than or equal to 3 mm and less than or equal to 15 mm. A range of a Pitch value between the plurality of LED luminous units 20 is optimized, so that the luminous performance of the backlight module 1 is controlled more accurately to improve a picture display effect of the display device.

For adaptation to manufacturing of different display devices to improve the practicability of the backlight module 1, in some embodiments, the substrate 10 includes one of an FR-4 substrate, an aluminum substrate and a Bismaleimide Triazine (BT) substrate.

The present application also provides an optional embodiment. The first luminous peak wavelength is in a first alternative range value, the second luminous peak wavelength is in a second alternative range value, the preset wavelength is in a third alternative range value, a maximum value in the third alternative range value is a half of a sum of a maximum value in the first alternative range value and a maximum value in the second alternative range value, and a minimum value in the third alternative range value is a half of a sum of a minimum value in the first alternative range value and a minimum value in the second alternative range value.

In some embodiments, a difference value between the maximum value and minimum value in the first alternative range value is greater than 0 nm and less than or equal to 3 nm, a difference value between the maximum value and minimum value in the second alternative range value is greater than 0 nm and less than or equal to 3 nm, and a difference value between the maximum value and minimum value in the third alternative range value is greater than 0 nm and less than or equal to 3 nm.

In some embodiments, the preset wavelength is a half of a sum of the first luminous peak wavelength and the second luminous peak wavelength.

As shown in FIG. 3, a spacing distance between the backlight module 1 and the optical module 2 is more than or equal to 2 mm and less than or equal to 12 mm. An Optical Distance (OD) value of the display device is optimized, so that improvement of the luminous performance of the backlight module 1 is facilitated, and the display performance of the display device is further improved.

As shown in FIG. 3, the optical component layer 201 includes a diffuser plate, a diffusion film and a prism film, and the conversion film layer 202 is a phosphor film layer including one or more of yellow phosphor, green phosphor and red phosphor or a quantum dot film layer.

The above are only some embodiments of the present disclosure and not intended to limit the present disclosure. For those skilled in the art, the present disclosure has various modifications and variations. Any modifications, equivalent replacements, improvements and the like made within the spirit and principle of the present disclosure shall fall within the scope of protection of the present disclosure.

What is claimed is:

1. A backlight module, comprising:
   a substrate; and
   a plurality of light-emitting diode luminous units, wherein the plurality of light-emitting diode luminous units are arranged at intervals on the substrate in a length direction and width direction of the substrate;
   wherein part of the plurality of light-emitting diode luminous units are a plurality of first luminous units A with a first luminous peak wavelength, and the other part of the plurality of light-emitting diode luminous units are a plurality of second luminous units C with a second luminous peak wavelength, wherein the first luminous peak wavelength is less than a preset wavelength, the preset wavelength is a peak wavelength after light mixing of the plurality of light-emitting diode luminous units and the second luminous peak wavelength is greater than the preset wavelength; and the plurality of first luminous units A and the plurality of second luminous units C are alternately arranged in sequence in the length direction and width direction of the substrate, such that one of any two adjacent light-emitting diode luminous units of the plurality of light-emitting diode luminous units in the length direction or width direction of the substrate is a first luminous unit A and the other of the any two adjacent LED luminous units (20) is a second luminous unit C.

2. The backlight module as claimed in claim 1, wherein the light-emitting diode luminous unit is a light-emitting diode luminous device.

3. The backlight module as claimed in claim 1, wherein the first luminous peak wavelength is in a first optional range value, and a difference value between a maximum value and minimum value in the first optional range value is greater than 0 nm and less than or equal to 3 nm; the second luminous peak wavelength is in a second optional range value, and a difference value between a maximum value and minimum value in the second optional range value is greater than 0 nm and less than or equal to 3 nm; and the preset wavelength is in a third optional range value, and a difference value between a maximum value and minimum value in the third optional range value is greater than 0 nm and less than or equal to 3 nm.

4. The backlight module as claimed in claim 3, wherein the first optional range value is 441 nm to 443 nm, the second optional range value is 445 nm to 447 nm, and the third optional range value is 443 nm to 445 nm.

5. The backlight module as claimed in claim 1, wherein the plurality of light-emitting diode luminous units are distributed on the substrate in form of a matrix, and a center distance between two adjacent light-emitting diode luminous units in the plurality of light-emitting diode luminous units is more than or equal to 3 mm and less than or equal to 15 mm.

6. The backlight module as claimed in claim 1, wherein the substrate comprises one of an FR-4 substrate, an aluminum substrate and a Bismaleimide Triazine (BT) substrate.

7. The backlight module as claimed in claim 1, wherein the first luminous peak wavelength is in a first alternative range value, the second luminous peak wavelength is in a second alternative range value, the preset wavelength is in a third alternative range value, a maximum value in the third alternative range value is a half of a sum of a maximum value in the first alternative range value and a maximum value in the second alternative range value, and a minimum value in the third alternative range value is a half of a sum of a minimum value in the first alternative range value and a minimum value in the second alternative range value.

8. The backlight module as claimed in claim 7, wherein a difference value between the maximum value and minimum value in the first alternative range value is greater than 0 nm and less than or equal to 3 nm, a difference value between the maximum value and minimum value in the second alternative range value is greater than 0 nm and less than or equal to 3 nm, and a difference value between the maximum value and minimum value in the third alternative range value is greater than 0 nm and less than or equal to 3 nm.

9. A display device, comprising an optical module and the backlight module as claimed in claim 1, wherein the optical module and the backlight module are arranged at intervals, and the optical module comprises an optical component layer, a conversion film layer and a liquid crystal glass layer.

10. The display device as claimed in claim 9, wherein a spacing distance between the backlight module and the optical module is more than or equal to 2 mm and less than or equal to 12 mm.

11. The display device as claimed in claim 9, wherein the optical component layer comprises a diffuser plate, a diffusion film and a prism film, and the conversion film layer comprises a phosphor film layer comprising one or more of yellow phosphor, green phosphor and red phosphor or a quantum dot film layer.

12. The display device as claimed in claim 9, wherein the light-emitting diode luminous unit is a light-emitting diode luminous device.

13. The display device as claimed in claim 9, wherein the first luminous peak wavelength is in a first optional range value, and a difference value between a maximum value and minimum value in the first optional range value is greater than 0 nm and less than or equal to 3 nm; the second luminous peak wavelength is in a second optional range value, and a difference value between a maximum value and minimum value in the second optional range value is greater than 0 nm and less than or equal to 3 nm; and the preset wavelength is in a third optional range value, and a difference value between a maximum value and minimum value in the third optional range value is greater than 0 nm and less than or equal to 3 nm.

14. The display device as claimed in claim 13, wherein the first optional range value is 441 nm to 443 nm, the second optional range value is 445 nm to 447 nm, and the third optional range value is 443 nm to 445 nm.

15. The display device as claimed in claim 9, wherein the plurality of light-emitting diode luminous units are distributed on the substrate in form of a matrix, and a center distance between two adjacent light-emitting diode luminous units in the plurality of light-emitting diode luminous units is more than or equal to 3 mm and less than or equal to 15 mm.

16. The display device as claimed in claim 9, wherein the substrate is one of an FR-4 substrate, an aluminum substrate and a Bismaleimide Triazine (BT) substrate.

17. The display device as claimed in claim 9, wherein the first luminous peak wavelength is in a first alternative range value, the second luminous peak wavelength is in a second alternative range value, the preset wavelength is in a third alternative range value, a maximum value in the third alternative range value is a half of a sum of a maximum value in the first alternative range value and a maximum value in the second alternative range value, and a minimum value in the third alternative range value is a half of a sum of a minimum value in the first alternative range value and a minimum value in the second alternative range value.

18. The display device as claimed in claim 17, wherein a difference value between the maximum value and minimum value in the first alternative range value is greater than 0 nm and less than or equal to 3 nm, a difference value between the maximum value and minimum value in the second alternative range value is greater than 0 nm and less than or equal to 3 nm, and a difference value between the maximum value and minimum value in the third alternative range value is greater than 0 nm and less than or equal to 3 nm.

* * * * *